United States Patent
Tsumura et al.

(10) Patent No.: US 8,008,186 B2
(45) Date of Patent: Aug. 30, 2011

(54) SEMICONDUCTOR DEVICE AND METHOD OF FABRICATING THE SAME

(75) Inventors: Kazumichi Tsumura, Kanagawa (JP); Masaki Yamada, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/719,666

(22) Filed: Mar. 8, 2010

(65) Prior Publication Data

US 2010/0167523 A1    Jul. 1, 2010

Related U.S. Application Data

(62) Division of application No. 11/485,636, filed on Jul. 13, 2006, now Pat. No. 7,687,910.

(30) Foreign Application Priority Data

Jul. 15, 2005    (JP) .................................. 2005-207814

(51) Int. Cl.
*H01L 21/00*    (2006.01)

(52) U.S. Cl. ........ 438/623; 438/622; 438/637; 438/659; 438/687; 257/E21.218; 257/E21.252; 257/E21.576; 257/E21.589; 257/E21.591

(58) Field of Classification Search .......... 438/618–637, 438/659, 687; 257/E21.218, 252, 576–591
See application file for complete search history.

(56) References Cited

U.S. PATENT DOCUMENTS

| | | | |
|---|---|---|---|
| 6,096,648 A * | 8/2000 | Lopatin et al. | 438/687 |
| 6,346,438 B1 * | 2/2002 | Yagishita et al. | 438/197 |
| 6,531,403 B2 * | 3/2003 | Ezaki | 438/710 |
| 7,026,715 B2 | 4/2006 | Matsunaga et al. | |
| 7,091,618 B2 | 8/2006 | Yoshizawa et al. | |
| 7,329,601 B2 * | 2/2008 | Miyajima | 438/637 |
| 7,615,474 B2 * | 11/2009 | Kurosawa | 438/584 |
| 2002/0187625 A1 | 12/2002 | Shimooka et al. | |
| 2003/0001278 A1 | 1/2003 | Kojima et al. | |
| 2005/0116357 A1 * | 6/2005 | Fitzsimmons et al. | 257/787 |
| 2005/0151266 A1 | 7/2005 | Yoshizawa et al. | |
| 2006/0046472 A1 | 3/2006 | Sandhu et al. | |
| 2006/0261483 A1 | 11/2006 | Tsumura et al. | |

FOREIGN PATENT DOCUMENTS

JP    2002-353308 A    12/2002

OTHER PUBLICATIONS

K. Tsumura, U.S. PTO Notice of Allowance, U.S. Appl. No. 11/485,636, dated Nov. 17, 2009, 7 pages.
K. Tsumura, U.S. PTO Office Action, U.S. Appl. No. 11/485,636, dated Apr. 17, 2009, 8 pages.
K. Tsumura, U.S. PTO Final Office Action, U.S. Appl. No. 11/485,636, dated Dec. 15, 2008, 10 pages.
K. Tsumura, U.S. PTO Office Action, U.S. Appl. No. 11/485,636, dated Jun. 4, 2008, 11 pages.
U.S. Appl. No. 11/248,608, filed Oct. 13, 2005, Tsumura et al.

* cited by examiner

*Primary Examiner* — Michael S Lebentritt
(74) *Attorney, Agent, or Firm* — Foley & Lardner LLP

(57) ABSTRACT

A semiconductor device according to an embodiment of the present invention includes a semiconductor substrate; a wiring formed in predetermined pattern above the semiconductor substrate, a first insulating film lying right under the wiring, and a second insulating film lying in a peripheral portion other than a portion right under the wiring, in which a surface layer of the first insulating film lying in a boundary surface between the first insulating film and the second insulating film is chemically modified to reinforce the surface layer.

15 Claims, 8 Drawing Sheets

SEMICONDUCTOR DEVICE AND METHOD OF FABRICATING THE SAME

CROSS-REFERENCE TO RELATED APPLICATIONS

This application is a Divisional of U.S. application Ser. No. 11/485,636, filed Jul. 13, 2006, which is based upon and claims the benefit of priority from prior Japanese Patent Application No. 2005-207814, filed Jul. 15, 2005, the entire contents of which are incorporated herein by reference.

BACKGROUND OF THE INVENTION

The present invention relates to a semiconductor device and a method of fabricating the same, and more particularly to a semiconductor device in which an insulating film having a low relative dielectric constant is used as an interlayer insulating film of a multi-layer interconnection structure, and a method of fabricating the same.

In recent years, semiconductor integrated circuits have kept on promoting high integration, and as circuits have been shrunk, a request for a wiring resistance and a capacity of an interlayer insulating film has become severe from a viewpoint of a processing speed and power consumption of the semiconductor devices. In view of this actual situation, a metal such as copper having a small resistance has been used as a wiring material, or an insulating film such as methyl siloxane having a low relative dielectric constant has been used as an interlayer insulating film, thereby forming multi-layer interconnection.

At present, a damascene method as a buried copper wiring technique is used in patterning of a copper wiring which has been conventionally difficult to pattern in many cases.

On the other hand, an organic insulating film such as a methyl siloxane film having a low relative dielectric constant of 3.0 or less has been used as an insulating film, and a technique for applying such an organic insulating film to the multi-layer interconnection has been developed.

However, although the insulating film having a low relative dielectric constant is required, the insulating film having a relative dielectric constant of 3.0 or less has low resistance against a damage caused during the etching, and also has low mechanical strength. As a result, various adverse effects are encountered when this sort of insulating film is used as an interlayer insulating film of the copper multi-layer interconnection which is formed by utilizing the damascene method.

In the case of the insulating film having the low relative dielectric constant, while the etching is performed, a methyl group of a surface layer is easy to de-couple and thus a molecular structure is easy to destroy. As a result, the insulating film is damaged, so that a layer having a reduced carbon concentration (hereinafter referred to as "a damaged layer") is formed. Water is absorbed on the damaged layer having the de-coupled methyl group. When a heat treatment in a wiring material-burying process after etching or a subsequent upper layer interconnection structure-forming process is performed, the water absorbed on the damaged layer oxidizes a barrier metal, of which a sidewall for a via hole is made, in the vicinity of the damaged layer to degrade adhesiveness between a wiring material and the barrier metal, thereby causing deterioration of electrical characteristics of the semiconductor device and degradation of reliability thereof.

Japanese Patent KOKAI No. 2002-353308 has reported a technique with which the damaged layer formed in such a manner is exposed to hexa methyl disilazane (HMDS) gas ambient atmosphere or HMDS liquid is applied to the damaged layer to re-bond a hydrocarbon group such as a methyl group to a portion having a de-coupled methyl group, thereby repairing that portion to its former state.

However, as the relative dielectric constant becomes lower, an amount of damage received by the film further increases, and thus it is feared that the film is more largely damaged than it can be perfectly repaired. As a result, the technique disclosed in Japanese Patent KOKAI No. 2002-353308 involves such a defect that it is impossible to employ an insulating film having too low relative dielectric constant. Thus, a method disclosed in Japanese Patent KOKAI No. 2002-353308 employs an insulating film having a relative dielectric constant of about 2.7.

On the other hand, United States Patent Application Publication No. 2002/0187625 has reported the following technique as one of methods of, when an insulating film having a low relative dielectric constant is used in multi-layer interconnection, suppressing a damage caused by etching. That is to say, with this technique, after a wiring is formed in an insulating film which has a relatively high relative dielectric constant and which has high etching resistance, this insulating film is etched away by etching, and an insulating film having a low relative dielectric constant is newly buried in the etched portion.

However, in this technique, when the insulating film having the relatively high relative dielectric constant is removed by the etching after formation of the wiring, its portion under the wiring cannot be perfectly removed to be partially left. For this reason, although the insulating film having the low relative dielectric constant can be buried in the portion from which the insulating film having the relatively high relative dielectric constant could be removed by the etching, the insulating film having the relatively high relative dielectric constant is left to the last in the portion from which the insulating film having the relatively high relative dielectric constant could not be perfectly removed by the etching.

BRIEF SUMMARY OF THE INVENTION

A semiconductor device according to one embodiment of the present invention includes:
  a semiconductor substrate;
  a wiring formed in predetermined pattern above the semiconductor substrate;
  a first insulating film lying right under the wiring; and
  a second insulating film lying in a peripheral portion other than a portion right under the wiring,
  in which a surface layer of the first insulating film lying in a boundary surface between the first insulating film and the second insulating film comprises a higher carbon concentration than an inside of the first insulating film.

A semiconductor device according to another embodiment of the present invention includes:
  a semiconductor substrate;
  a wiring formed in predetermined pattern above the semiconductor substrate;
  a first insulating film lying right under the wiring; and
  a second insulating film lying in a peripheral portion other than a portion right under the wiring,
  in which a surface layer of the first insulating film lying in a boundary surface between the first insulating film and the second insulating film is chemically modified to reinforce the surface layer.

A method of fabricating a semiconductor device according to still another embodiment of the present invention includes:
  forming a first insulating film;
  forming a wiring in the first insulating film;

removing the first insulating film with a portion of the first insulating film right under the wiring being left to form a trench;

repairing a damage of a portion exposed on the trench of the first insulating film left right under the wiring; and forming a second insulating film having a relative dielectric constant lower than that of the first insulating film in the trench.

DETAILED DESCRIPTION OF THE INVENTION

FIGS. 1A to 1H are respectively cross sectional views showing processes for fabricating a semiconductor device according to a first embodiment of the present invention by utilizing a dual damascene method.

Figure 1A:
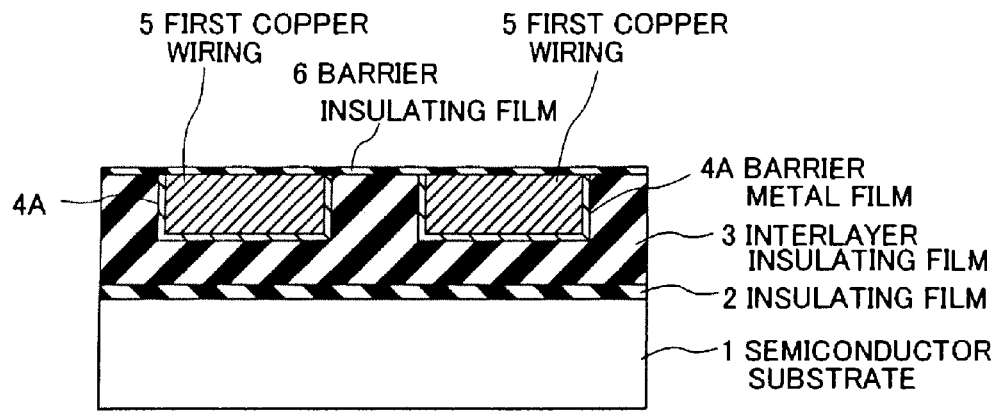
FIGS. 1A to 1H are respectively cross sectional views showing processes for fabricating a semiconductor device according to a first embodiment of the present invention.

As shown in FIG. 1A, an insulating film 2 is formed on a semiconductor substrate 1 on which a semiconductor element (not shown) is formed, and an interlayer insulating film 3 is formed on the insulating film 2. A first copper wiring 5 is formed in the interlayer insulating film 3 in a state of being covered with a barrier metal layer 4A. Moreover, for example, an SiN film is formed as a barrier insulating film 6 on an exposed portion of the interlayer insulating film 3, and the first copper wiring 5. Here, the barrier insulating film 6 prevents copper diffusion and oxidation of the first copper wiring 5, and also prevents a damage caused by etching made for an upper layer.

Figure 1B:
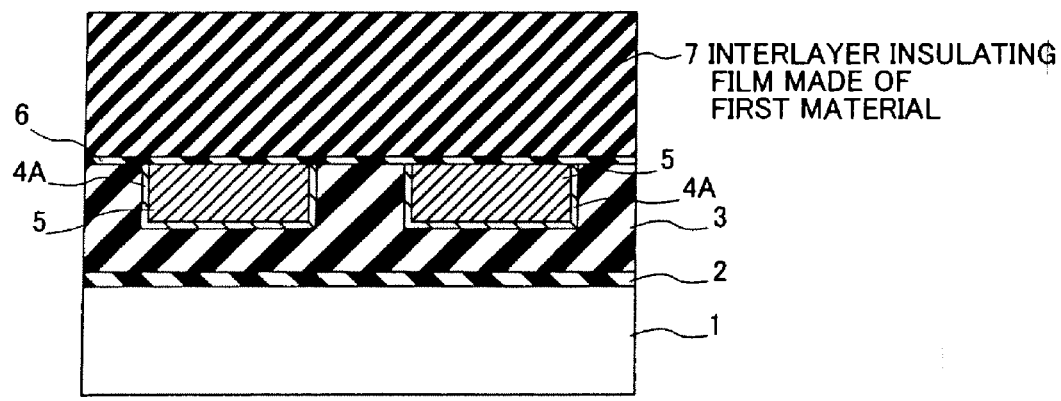

Next, as shown in FIG. 1B, an interlayer insulating film 7 made of a first material is formed on the barrier insulating film 6. Here, the first material is porous methyl siloxane having a Si—CH$_3$ bond containing therein a methyl group. The interlayer insulating film 7 made of the first material has a relative dielectric constant that is not lower than 2.2 and not higher than 3.0. Incidentally, a material containing therein a siloxane bond as a main backbone and a hydrocarbon group bonded to Si of the siloxane bond can be used as the first material in addition to porous methyl siloxane.

Figure 1C:
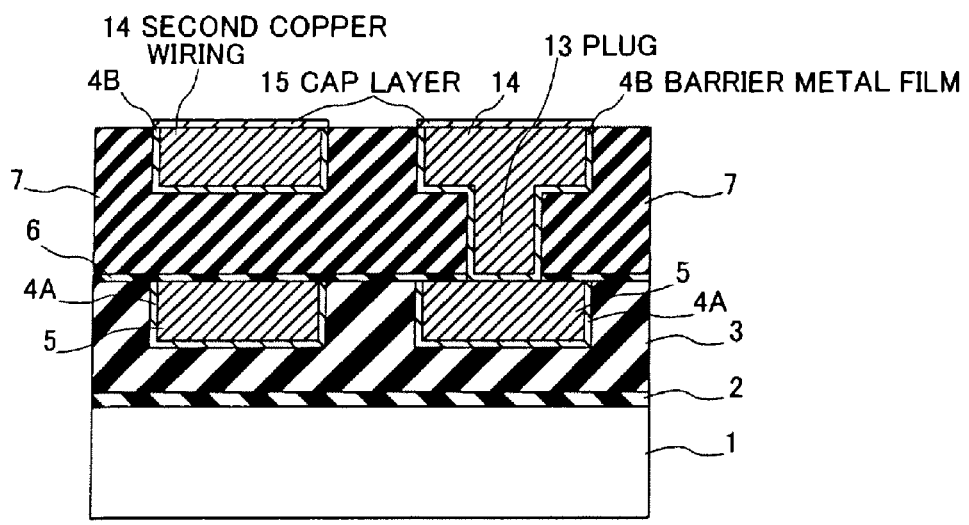

Next, as shown in FIG. 1C, a barrier metal film 4B, a plug 13 and a second copper wiring 14 are formed in the interlayer insulating film 7 made of the first material. Moreover, a cap layer 15 may be formed on an exposed surface of the second copper wiring 14. Here, the cap layer 15 is formed by utilizing a CapMetal technique for selectively growing a metal such as CoWB, or a photolithography technique and an etching technique, or the like for patterning an insulating film, after deposition of the insulating film made of SiN, SiCN, SiC or the like. The cap layer 15 can prevent copper diffusion and oxidation of a copper wiring, and also can prevent a damage of the second copper wiring 14 caused by etching made for an upper layer.

Figure 1D:
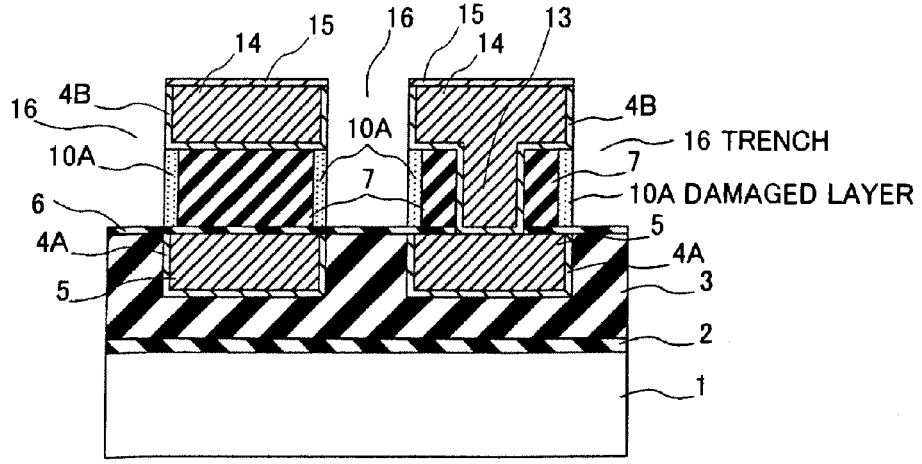

Next, as shown in FIG. 1D, the interlayer insulating film 7 made of the first material is removed by using the second copper wiring 14 as a mask until the barrier insulating film 6 is exposed, thereby forming a trench 16. At this time, a surface layer of the interlayer insulating film 7 made of the first material left under the second copper wiring 14 becomes a damaged layer 10A since its methyl group is de-coupled by a damage caused during the etching.

Figure 1E:
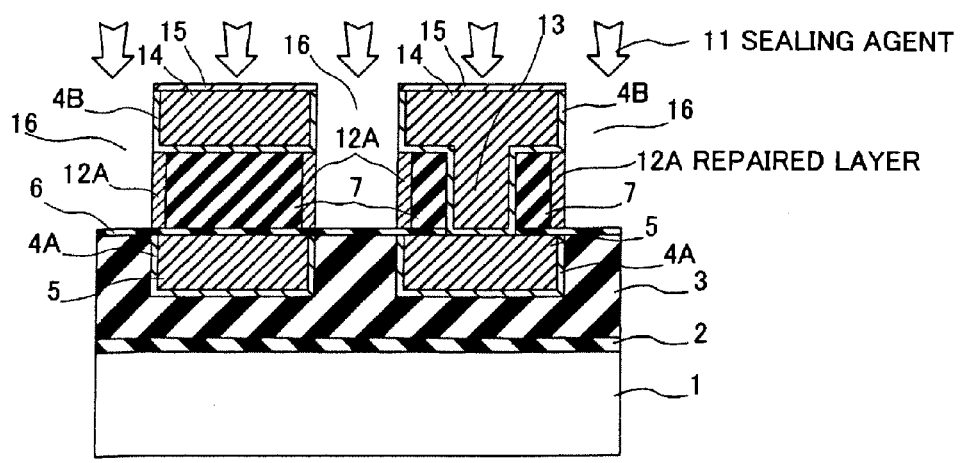

Next, as shown in FIG. 1E, the damaged layer 10A is subjected to repair processing using a sealing agent 11 of HMDS gas or liquid to re-bond a hydrocarbon group such as a methyl group to a portion, having the de-coupled methyl group, of the interlayer insulating film 7 made of the first material, thereby forming a repaired layer 12A. Here, the repaired layer 12A portion has a carbon concentration higher than that of the inside, of the interlayer insulating film 7 made of the first material, which has not been damaged. More specifically, the repaired layer 12A portion has the carbon concentration of 5 atm % or more in a position which is 15 nm deep in a perpendicular direction from a surface layer of the repaired layer 12A. After that, when HMDS liquid is used as the sealing agent, a heat treatment is performed at temperatures of 100 to 200° C. in order to remove the remaining excessive HMDS liquid.

Figure 1F:
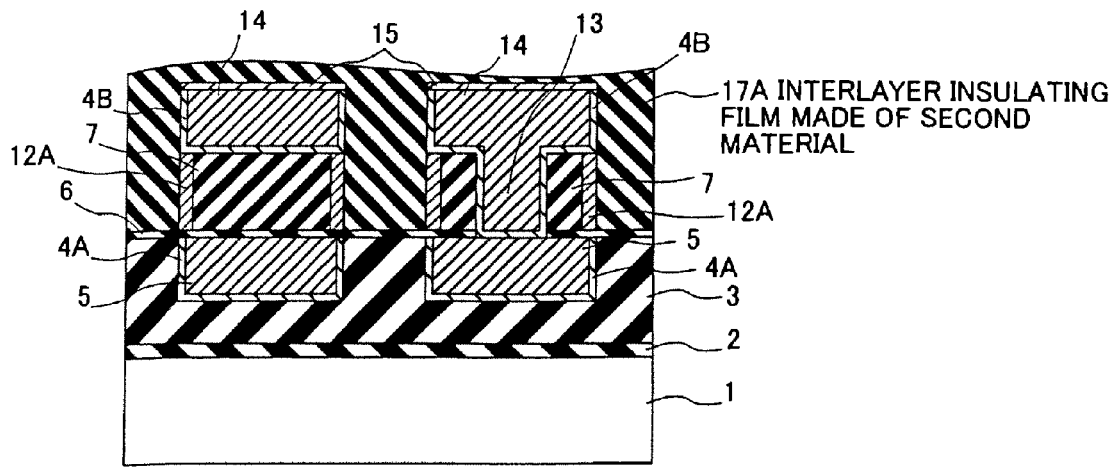

Next, as shown in FIG. 1F, an interlayer insulating film 17A made of a second material is deposited on the barrier insulating film 6 and the cap layer 15. Here, the second material is a porous insulating film having a relative dielectric constant lower than that of the first material. For example, a material such as porous methyl siloxane containing therein a siloxane bond as a main backbone and a hydrocarbon group bonded to Si of the siloxane bond, a material such as porous silica or porous hydrogen silsesquioxane containing therein the siloxane bond, an organic polymeric material such as porous poly arylene ether or porous poly arylene, or a resin, becoming a precursor of a porous insulating film, which has a C—C bond or a C═C bond as a main backbone can be used as the second material.

Figure 1G:
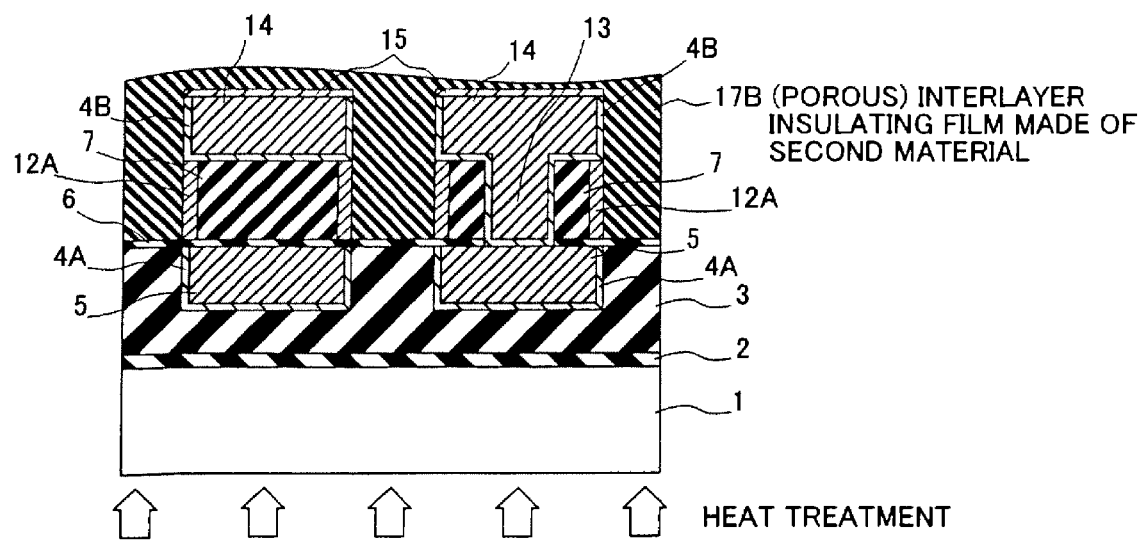

Incidentally, in a next process, as shown in FIG. 1G, a heat treatment may be performed at temperatures of 300 to 450° C. to activate a dehydration polymerization reaction and volatilize porogen, thereby changing the interlayer insulating film 17A made of the second material into a porous interlayer insulating film 17B made of the second material. Here, the porous interlayer insulating film 17B made of the second material has a relative dielectric constant that is not lower than 2.0 and not higher than 2.5.

Figure 1H:
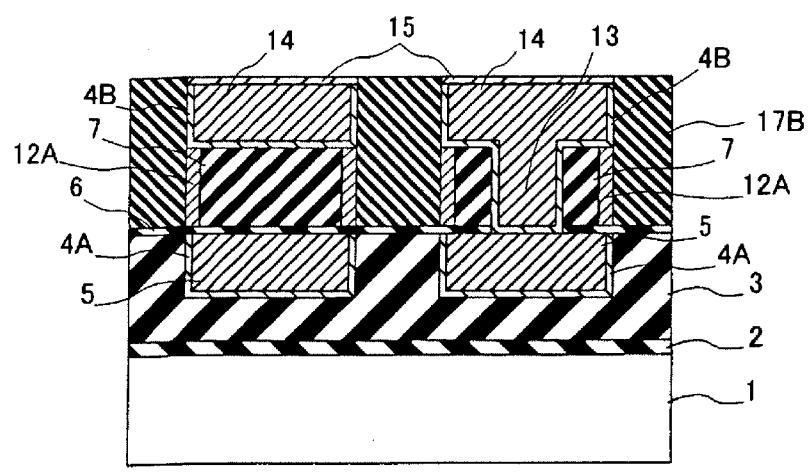

Next, as shown in FIG. 1H, the porous interlayer insulating film 17B made of the second material is polished, until the cap layer 15 is exposed, to be flattened by utilizing a CMP method or the like.

Now, when there is performed the heat treatment for changing the interlayer insulating film 17A made of the second material into the porous interlayer insulating film 17B made of the second material, the flattening processing may be performed before that heat treatment. That is to say, after the interlayer insulating film 17B made of the second material is polished, until the cap layer 15 is exposed, to be flattened by utilizing the CMP method or the like, the heat treatment is performed at temperatures of 300 to 450° C. to activate the dehydration polymerization reaction and volatilize porogen, thereby changing the interlayer insulating film 17A made of the second material into the porous interlayer insulating film 17B made of the second material. Although in this embodiment, the heat treatment is performed to activate the dehydration polymerization reaction and volatilize porogen, thereby changing the interlayer insulating film 17A as the precursor into the porous interlayer insulating film 17B made of the second material, a method of forming the porous interlayer insulating film 17B is not limited to this method.

According to the first embodiment, the damaged layer 10A stimulating oxidation of the barrier metal 4B in a high temperature state during the heat treatment in the process for forming the interconnection structure and the process for forming the interconnection structure of an upper layer, and during the operation of the semiconductor device is repaired through the repair processing. As a result, the film which has the low relative dielectric constant of 3.0 or less and thus which is easy to receive the etching damage can be used as the interlayer insulating film 7 made of the first material when the second copper wiring 14 is formed. Also, since the interlayer insulating film 7 made of the first material is left to the last right under the wiring, use of the film having the low relative dielectric constant makes it possible to reduce the relative dielectric constant of the overall interlayer insulating films of the semiconductor device, thereby allowing signal delay to be suppressed.

In addition, in the case where a wiring width is narrow when the trench is formed in the interlayer insulating film 7 made of the first material, it is feared that the interlayer insulating film right under the wiring becomes fragile due to the etching damage and becomes too weak to support the wiring and thus is destroyed. However, performing the repair processing results in that the interlayer insulating film right under the wiring recovers its mechanical strength and the like from the etching damage, and its resistance against the wet etching is strengthened. As a result, the interlayer insulating film right under the wiring becomes able to support the wiring.

In addition, the interlayer insulating film 17A made of the second material is deposited and formed in the trench without utilizing the etching technique, which results in that a film having a low relative dielectric constant and thus having low etching resistance can be used as the second material.

In processes for fabricating a semiconductor device according to a second embodiment of the present invention, processes which will be described below are contained between the process shown in FIG. 1B and the process shown in FIG. 1C in the processes for fabricating the semiconductor device according to the first embodiment of the present invention. Since processes other than the following processes are the same as those in the first embodiment of the present invention, its description is omitted here for the sake of simplicity.

Figure 2A:
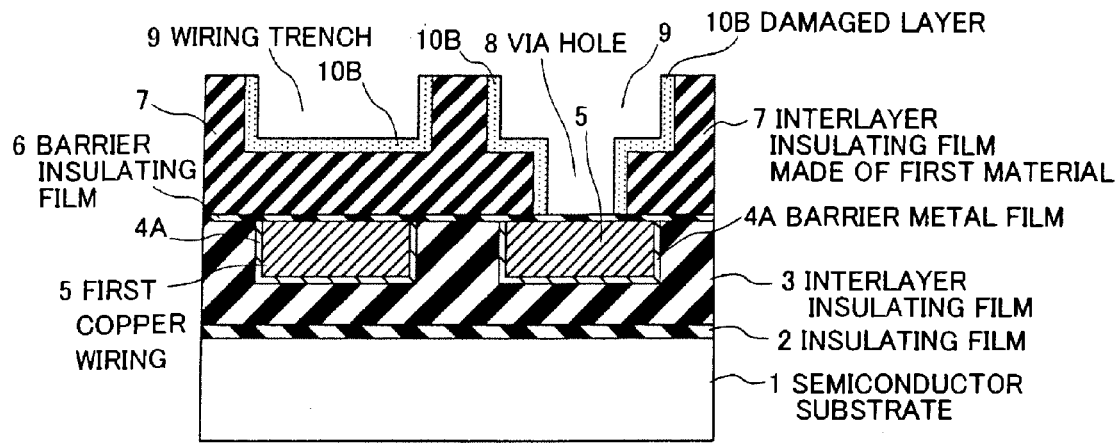
FIGS. 2A to 2C are respectively cross sectional views showing processes for fabricating a semiconductor device according to a second embodiment of the present invention.

After as shown in FIG. 1B, the interlayer insulating film 7 made of the first material is formed on the barrier insulating film 6, as shown in FIG. 2A, a via hole 8 and a wiring trench 9 are formed in the interlayer insulating film 7 made of the first material by utilizing a dry etching method using a fluorine system etching gas. At this time, a surface of the interlayer insulating film 7 made of the first material as a wall surface of the via hole 8 and the wiring trench 9 becomes a damaged layer 10B since its methyl group is de-coupled due to a damage caused by the etching.

Figure 2B:
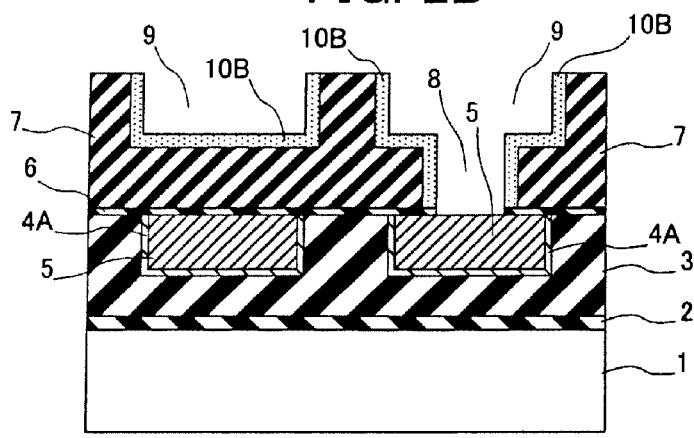

Next, as shown in FIG. 2B, a part of the barrier insulating film 6 corresponding to a bottom surface of the via hole 8 is etched away by utilizing the dry etching method to cause the via hole 8 to extend to the first copper wiring 5. After that, an etching deposit and the like are removed by subjecting the via hole 8 and the wiring trench 9 to the wet etching processing.

Figure 2C:
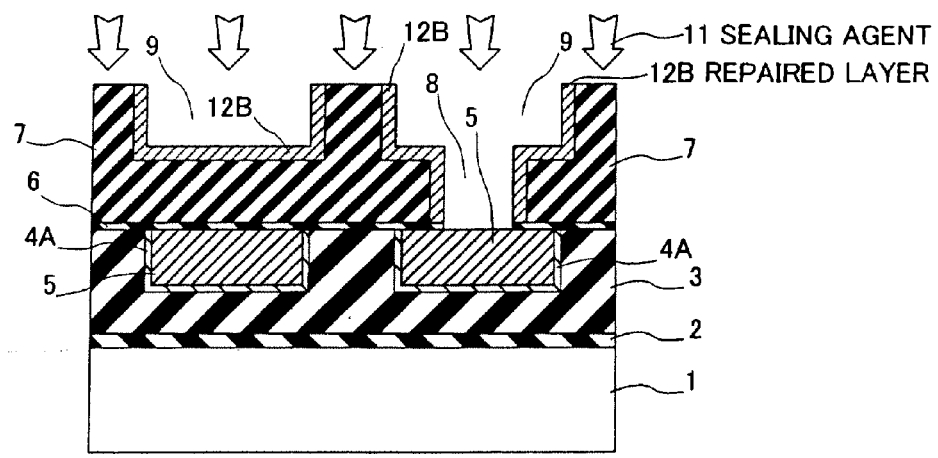

Next, as shown in FIG. 2C, the damaged layer 10B is subjected to repair processing using a sealing agent 11 of HMDS gas or liquid to re-bond a hydrocarbon group such as a methyl group to a portion, having the de-coupled methyl group, of the interlayer insulating film 7 made of the first material, thereby forming a repaired layer 12B. Here, the repaired layer 12B portion has a carbon concentration higher than that of the inside of the interlayer insulating film 7, made of the first material, which has not been damaged. More specifically, the repaired layer 12B portion has the carbon concentration of 5 atm % or more in a position which is 15 nm deep in a perpendicular direction from a surface layer of the repaired layer 12B. After that, when HMDS liquid is used as the sealing agent 11, a heat treatment is then performed at temperatures of 100 to 200° C. in order to remove the remaining excessive HMDS liquid.

Next, as shown in FIG. 1C, after TaN is sputtered, Cu is deposited thereon by utilizing an electrolytic plating method, and flattening is performed by utilizing the CMP method or the like, thereby forming the barrier metal film 4B, the plug 13 and the second copper wiring 14.

The repair processing is also performed for the damaged layer 10B of the via hole 8 and the wiring trench 9 which are formed in the interlayer insulating film 7 made of the first material, which results in that deterioration of the electrical characteristics of semiconductor device and degradation of the reliability thereof can be more effectively suppressed.

FIGS. 3A to 3J are respectively cross sectional views showing processes for fabricating a semiconductor device according to a third embodiment of the present invention by utilizing a single damascene method.

Figure 3A:
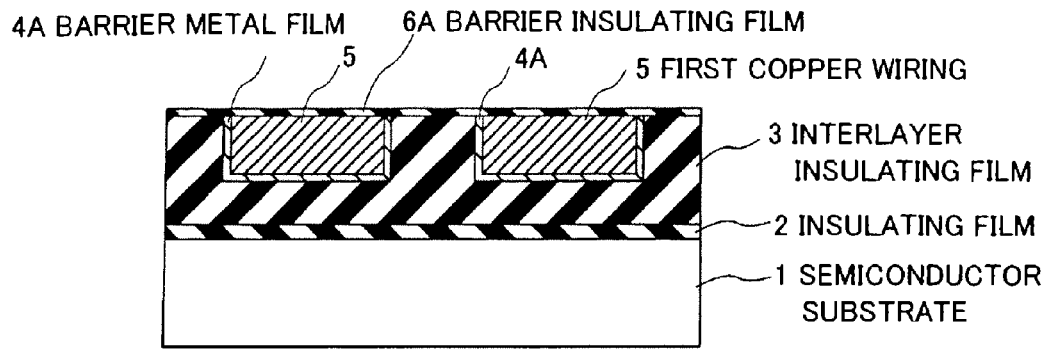
FIGS. 3A to 3J are respectively cross sectional views showing processes for fabricating a semiconductor device according to a third embodiment of the present invention.

As shown in FIG. 3A, an insulating film 2 is formed on a semiconductor substrate 1 on which a semiconductor element (not shown) is formed, and an interlayer insulating film 3 is formed on the insulating film 2. A first copper wiring 5 is formed in the interlayer insulating film 3 in a state of being covered with a barrier metal layer 4A. Moreover, for example, an SiN film is formed as a barrier insulating film 6A on an exposed portion of the interlayer insulating film 3, and the first copper wiring 5. Here, the barrier insulating film 6A prevents copper diffusion and oxidation of a copper wiring, and also prevents a damage of the copper wiring caused by etching made for an upper layer.

Figure 3B:
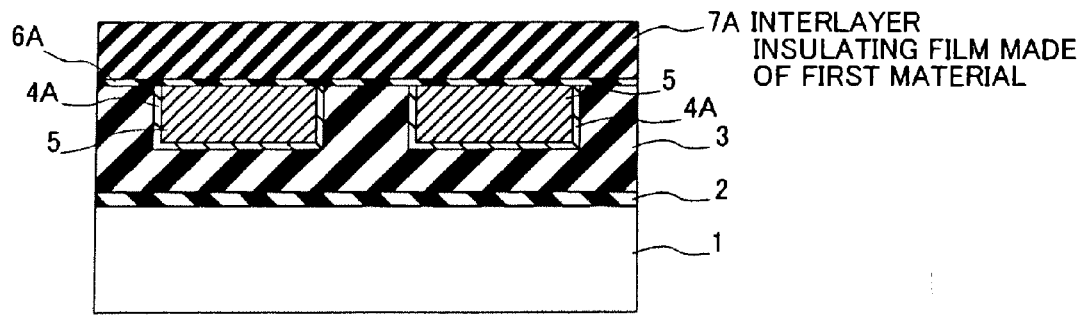

Next, as shown in FIG. 3B, an interlayer insulating film 7A made of a first material is formed on the barrier insulating film 6A. Here, the first material is porous methyl siloxane having a Si—CH$_3$ bond containing therein a methyl group. The interlayer insulating film 7A made of the first material has a relative dielectric constant that is not lower than 2.2 and not higher than 3.0.

Figure 3C:
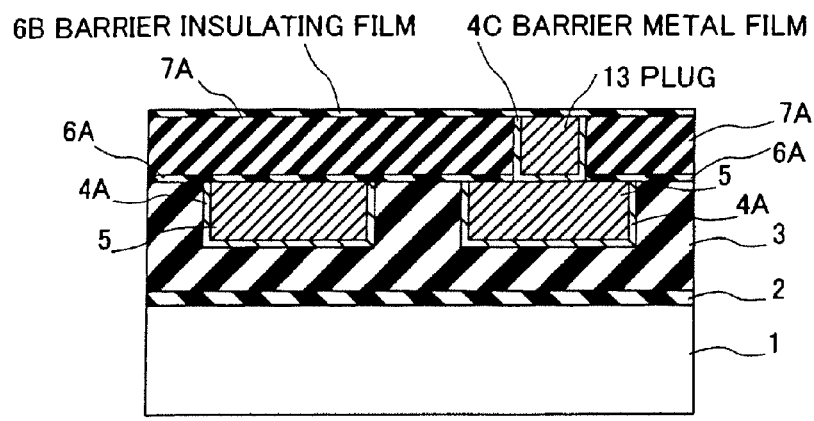

Next, as shown in FIG. 3C, a barrier metal film 4C and a plug 13 are formed in the interlayer insulating film 7A made of the first material. Moreover, a barrier insulating film 6B formed of, for example, an SiN film is formed on the plug 13 and the interlayer insulating film 7A made of the first material.

Figure 3D:
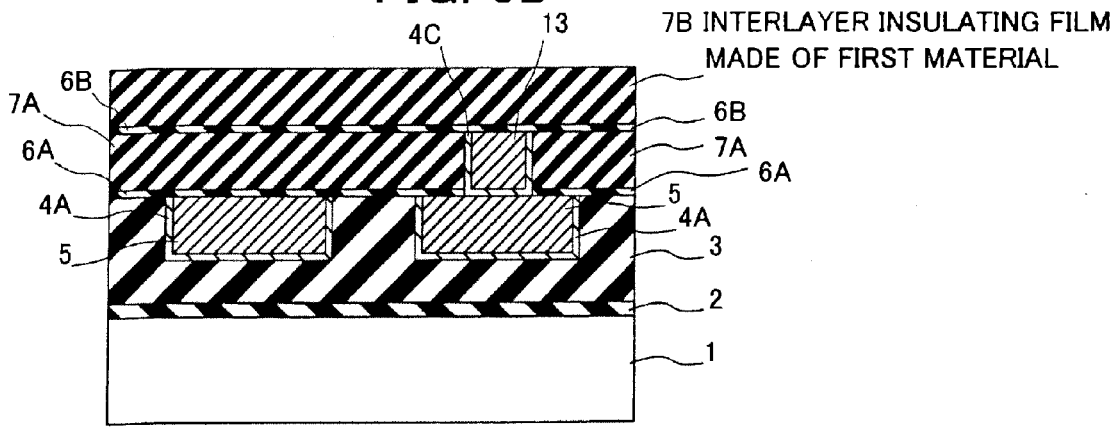

Next, as shown in FIG. 3D, an interlayer insulating film 7B made of the first material is formed on the barrier insulating film 6B. Here, the first material is porous methyl siloxane having a Si—CH$_3$ bond containing therein a methyl group. The interlayer insulating film 7B made of the first material has a relative dielectric constant that is not lower than 2.2 and not higher than 3.0. Incidentally, in addition to porous methyl siloxane, a material containing therein a siloxane bond as a main backbone and a hydrocarbon group bonded to Si of the siloxane bond can also be used as the first material of which each of the interlayer insulating films 7A and 7B is made.

Figure 3E:
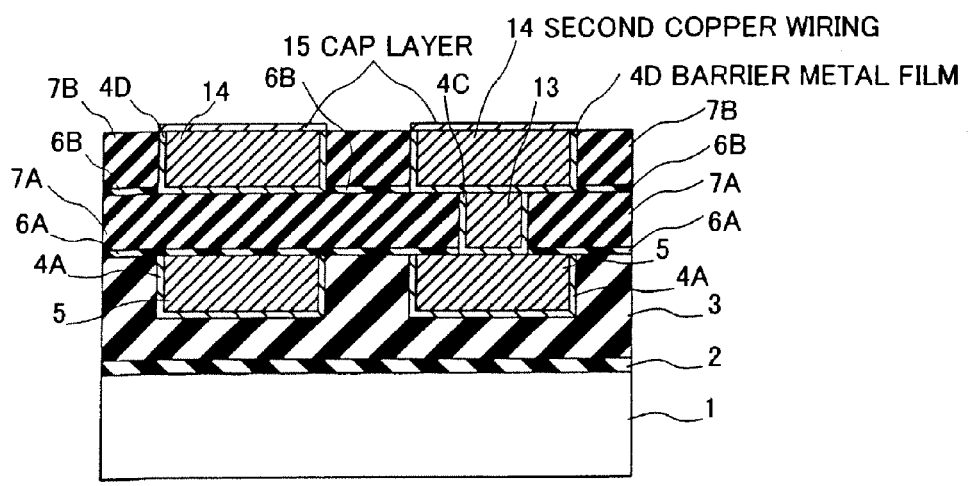

Next, as shown in FIG. 3E, a barrier metal 4D and a second copper wiring 14 are formed in the interlayer insulating film 7B made of the first material. Moreover, a cap layer 15 may be formed on the second copper wiring 14.

Figure 3F:
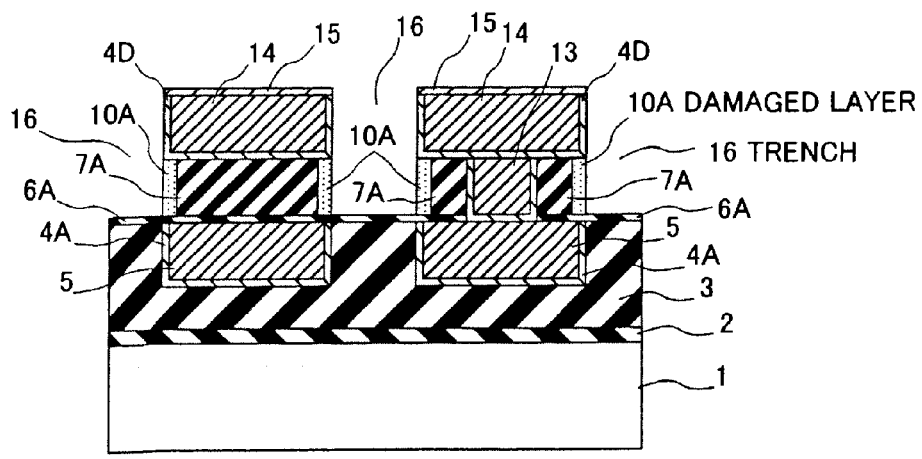

Next, as shown in FIG. 3F, the interlayer insulating film 7A made of the first material, the barrier insulating film 6B and the interlayer insulating film 7B made of the first material are removed by using the second copper wiring 14 as a mask until the barrier insulating film 6A is exposed. At this time, a surface of the interlayer insulating film 7A made of the first material left below the second copper wiring 14 becomes a damaged layer 10A since its methyl group is de-coupled by a damage caused during the etching.

Figure 3G:
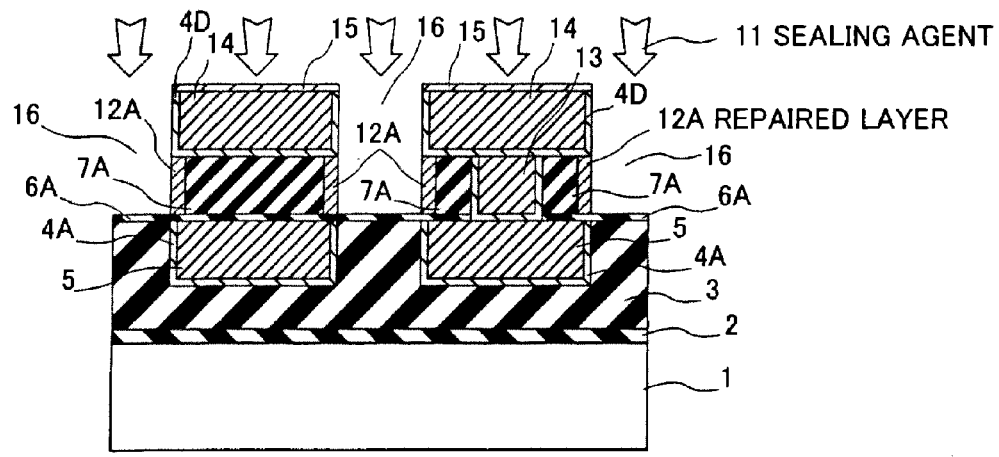

Next, as shown in FIG. 3G, the damaged layer 10A is subjected to repair processing using a sealing agent 11 of HMDS gas or liquid to re-bond a hydrocarbon group such as a methyl group to a portion, having the de-coupled methyl group, of the interlayer insulating film 7A made of the first material, thereby forming a repaired layer 12A. Here, the repaired layer 12A portion has a carbon concentration higher than that of the inside, of the interlayer insulating film 7A made of the first material, which has not been damaged. More specifically, the repaired layer 12A portion has the carbon concentration of 5 atom % or more in a position which is 15 nm deep in a perpendicular direction from a surface layer of the repaired layer 12A. After that, when HMDS liquid is used as the sealing agent 11, a heat treatment is then performed at temperatures of 100 to 200° C. in order to remove the remaining excessive HMDS liquid.

Figure 3H:
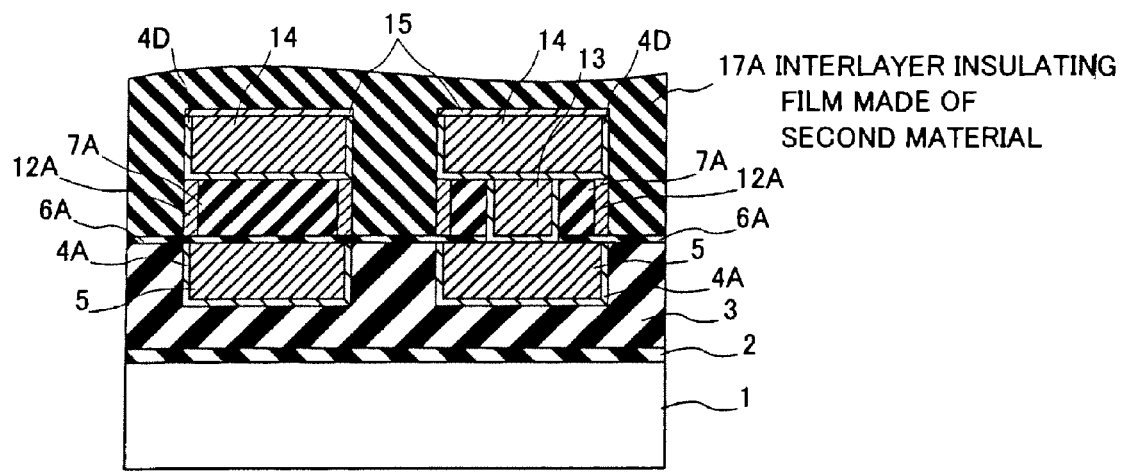

Next, as shown in FIG. 3H, an interlayer insulating film 17A made of a second material is deposited on the barrier insulating film 6A and the cap layer 15. Here, the second material is a porous insulating film having a relative dielectric constant lower than that of the first material. For example, a material such as porous methyl siloxane containing therein a siloxane bond as a main backbone and a hydrocarbon group bonded to Si of the siloxane bond, a material such as porous silica or porous hydrogen silsesquioxane containing therein the siloxane bond, an organic polymeric material such as porous poly arylene ether or porous poly arylene, or a resin, becoming a precursor of a porous insulating film, which has a C—C bond or a C=C bond as a main backbone can be used as the second material.

Figure 3I:
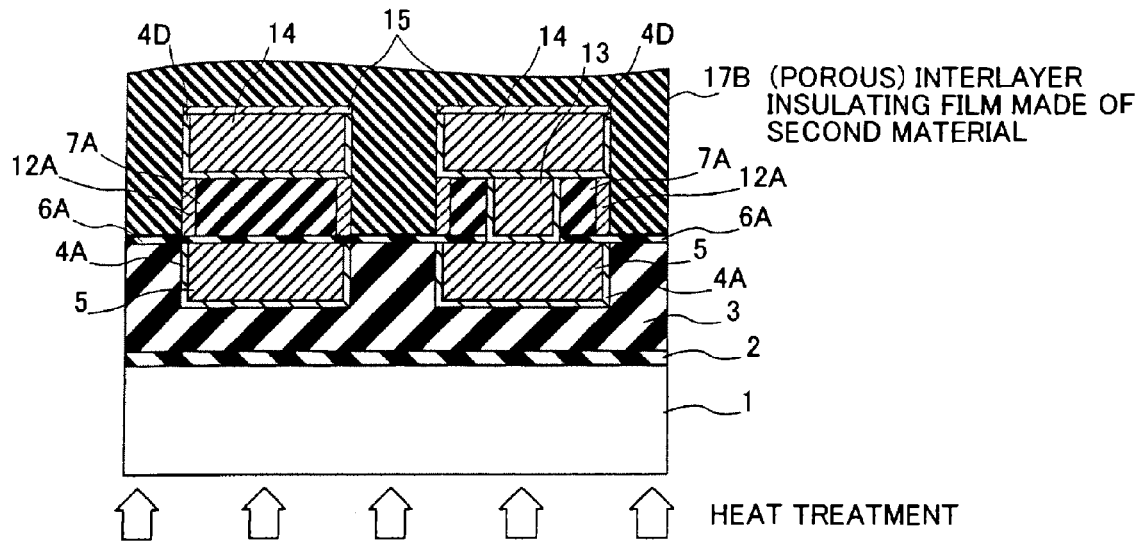

Incidentally, in a next process, as shown in FIG. 3I, a heat treatment may be performed at temperatures of 300 to 450° C. to activate a dehydration polymerization reaction and volatilize porogen, thereby changing the interlayer insulating film 17A made of the second material into a porous interlayer insulating film 17B made of the second material. Here, the porous interlayer insulating film 17B made of the second material has a relative dielectric constant that is not lower than 2.0 and not higher than 2.5.

Figure 3J:
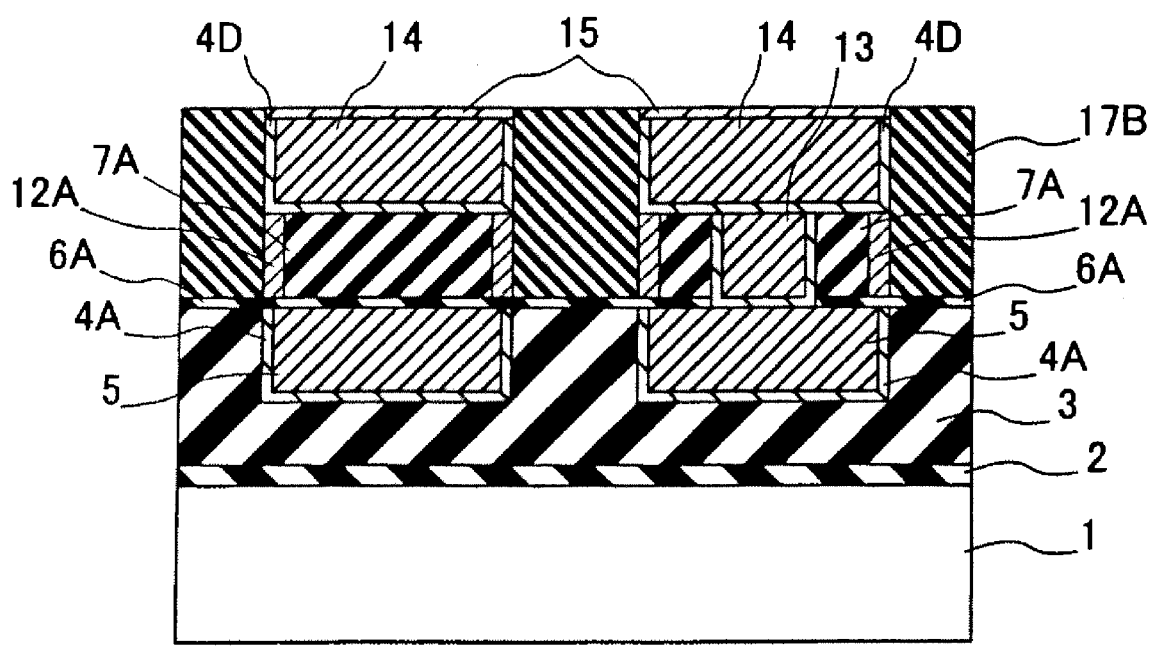

Next, as shown in FIG. 3J, the porous interlayer insulating film 17B made of the second material is polished, until the cap layer 15 is exposed, to be flattened by utilizing the CMP method or the like.

Incidentally, when there is performed a heat treatment for changing the interlayer insulating film 17A made of the second material into the porous interlayer insulating film 17B made of the second material, the flattening processing may be performed before that heat treatment. That is to say, after the interlayer insulating film 17A made of the second material is polished, until the cap layer 15 is exposed, to be flattened by utilizing the CMP method or the like, the heat treatment is performed at temperatures of 300 to 450° C. to activate a dehydration polymerization reaction and volatilize porogen, thereby changing the interlayer insulating film 17A made of the second material into the porous interlayer insulating film 17B made of the second material. Although in this embodiment, the porous interlayer insulating film 17B made of the second material is formed by activation of the dehydration polymerization reaction and volatilization of porogen through the heat treatment for the interlayer insulating film 17A as the precursor, a method of forming the porous interlayer insulating film 17B is not limited to this method.

It should be noted that each of the above-mentioned embodiments is merely an embodiment, the present invention is not limited to those embodiments, and thus the various changes thereof can be implemented without departing from the gist of the invention. For example, although each of the above-mentioned embodiments has been described by giving the fabrication of the layers, of the semiconductor device having the multi-layer structure, from the second level on, the present invention is not limited to the number of layers described above. In addition, although each of the above-mentioned embodiments has been described by exemplifying Cu as the metallic material for the wiring, the present invention is not limited thereto. That is to say, any other suitable material such as Al, Au, Ag or W may also be used instead of Cu. In addition, in the process for forming the plug 13 by utilizing the single damascene method as shown in FIG. 3C, the plug 13 may be formed after the damaged layer, of the surface of the interlayer insulating film 7A made of the first material, caused in formation of the via hole is subjected to the repair processing using the sealing agent 11 of HMDS gas or liquid. Also, in the process for removing the interlayer insulating film 7 made of the first material to form the trench 16 as shown in FIG. 1D, when no barrier insulating film 6 is used, in order to protect the interlayer insulating film 3, the interlayer insulating film 7 made of the first material may be left such that the interlayer insulating film 3 is not exposed without perfectly removing the interlayer insulating film 7 made of the first material. This is also applied to the process performed by utilizing the single damascene method as shown in FIG. 3F.

What is claimed is:

1. A method of fabricating a semiconductor device, comprising:
    forming a first insulating film;
    forming a wiring in the first insulating film;
    removing the first insulating film with a portion of the first insulating film right under the wiring being left to form a trench;
    repairing a damage of a portion exposed on the trench of the first insulating film left right under the wiring; and
    forming a second insulating film having a relative dielectric constant lower than that of the first insulating film in the trench.

2. The method of fabricating a semiconductor device according to claim 1, wherein: the damage is repaired by using hexa methyl disilazane.

3. The method of fabricating a semiconductor device according to claim 1, wherein:
    the formation of the wiring comprises:
    forming a wiring trench in which the wiring is buried by etching the first insulating film; and repairing an etching damage of a portion exposed on the wiring trench of the first insulating film.

4. The method of fabricating a semiconductor device according to claim 1, wherein:
    the wiring is electrically connected to a wiring of a lower layer of the wiring through a connection portion, and the wiring and the connection portion are formed in the same step by utilizing a dual damascene method.

5. The method of fabricating a semiconductor device according to claim 1, wherein:
    the wiring is electrically connected to a wiring of a lower layer of the wiring through a connection portion, and the wiring and the connection portion are formed in different steps by utilizing a single damascene method, respectively.

6. The method of fabricating a semiconductor device according to claim 1, wherein:
a boundary surface between the first insulating film and the second insulating film is provided substantially perpendicular to a top surface of the wiring.

7. The method of fabricating a semiconductor device according to claim 1, wherein:
the second insulating film surrounds the first insulating film.

8. The method of fabricating a semiconductor device according to claim 1, wherein:
a part of the second insulating film is provided in a same vertical position as the first insulating film.

9. The method of fabricating a semiconductor device according to claim 2, wherein:
the formation of the wiring comprises:
forming a wiring trench in which the wiring is buried by etching the first insulating film; and repairing an etching damage of a portion exposed on the wiring trench of the first insulating film.

10. The method of fabricating a semiconductor device according to claim 2, wherein:
a boundary surface between the first insulating film and the second insulating film is provided substantially perpendicular to a top surface of the wiring.

11. The method of fabricating a semiconductor device according to claim 2, wherein:
the second insulating film surrounds the first insulating film.

12. The method of fabricating a semiconductor device according to claim 2, wherein:
a part of the second insulating film is provided in a same vertical position as the first insulating film.

13. The method of fabricating a semiconductor device according to claim 3, wherein:
a boundary surface between the first insulating film and the second insulating film is provided substantially perpendicular to a top surface of the wiring.

14. The method of fabricating a semiconductor device according to claim 3, wherein:
the second insulating film surrounds the first insulating film.

15. The method of fabricating a semiconductor device according to claim 3, wherein:
a part of the second insulating film is provided in a same vertical position as the first insulating film.

* * * * *